(12) United States Patent
Brambilla et al.

(10) Patent No.: US 6,429,741 B2
(45) Date of Patent: Aug. 6, 2002

(54) CIRCUIT FOR DETECTING DISTORTION IN AN AMPLIFIER, IN PARTICULAR AN AUDIO AMPLIFIER

(75) Inventors: Davide Brambilla, Rho; Daniela Nebuloni; Mauro Cleris, both of Bareggio, all of (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 0 days.

(21) Appl. No.: 09/880,638

(22) Filed: Jun. 12, 2001

(30) Foreign Application Priority Data

Jun. 13, 2000 (EP) .............................. 00830419

(51) Int. Cl.[7] .............................. H03F 1/26; H03K 5/08
(52) U.S. Cl. .................. 330/149; 330/107; 327/317
(58) Field of Search .......................... 330/86, 107, 110, 330/149; 327/317, 318, 323, 236, 243

(56) References Cited

U.S. PATENT DOCUMENTS

| 3,825,854 A | 7/1974 | Pichal ..................... 330/149 |
| 4,048,573 A | 9/1977 | Evans et al. .................... 330/2 |
| 4,476,442 A | 10/1984 | Iwamatsu .................... 330/265 |
| 4,849,713 A | 7/1989 | Botti et al. .................. 330/284 |
| 5,068,620 A | 11/1991 | Botti et al. ..................... 330/2 |
| 5,121,077 A | * 6/1992 | McGann ..................... 330/107 |
| 5,327,101 A | * 7/1994 | Neely et al. ................. 330/136 |
| 5,442,316 A | 8/1995 | Buck et al. ..................... 330/2 |
| 5,642,076 A | * 6/1997 | Naokawa et al. ........... 330/149 |
| 6,275,104 B1 | * 8/2001 | Holter ........................ 330/110 |
| 6,285,255 B1 | * 9/2001 | Luu et al. .................... 330/149 |

FOREIGN PATENT DOCUMENTS

| EP | 0295497 A2 | 12/1988 |
| EP | 0427135 A2 | 5/1991 |

* cited by examiner

Primary Examiner—Robert Pascal
Assistant Examiner—Khanh Van Nguyen
(74) Attorney, Agent, or Firm—Lisa K. Jorgenson; Robert Iannucci; Seed IP Law Group PLLC

(57) ABSTRACT

An amplifier having an input; an output supplying an output signal, and a feedback network connected between the input and the output, and a distortion detection circuit. The feedback network includes a first and a second feedback element arranged in series and forming an intermediate node supplying an intermediate signal in phase with the output signal in absence of distortion, and in phase-opposition with the output signal in presence of distortion. The distortion detection circuit includes a phase-comparing circuit which detects the phase of the output signal and of the intermediate signal, and generates a distortion-indicative signal, when the intermediate signal is in phase opposition with respect to the output signal.

16 Claims, 3 Drawing Sheets

CIRCUIT FOR DETECTING DISTORTION IN AN AMPLIFIER, IN PARTICULAR AN AUDIO AMPLIFIER

TECHNICAL FIELD

The present invention relates to a circuit for detecting distortion in an amplifier, and in one embodiment, an audio amplifier.

BACKGROUND OF THE INVENTION

As is known, during normal operation of an audio amplifier, excessively strong signals applied at the input can cause auditive noise, or can damage the loudspeaker, when the amplifier reaches the maximum dynamic level and is saturated.

In order to solve this problem, a digital or analogue feedback circuit is normally provided and reduces the input signal when the output signal reaches a certain percentage of distortion. For this purpose, it is necessary to provide a distortion detector, which detects when the audio amplifier is in a distortion condition and generates a corresponding control signal for the feedback circuit. However, it has been found that the feedback circuit must not intervene immediately when the distortion occurs, since this reduces the output power perception; acoustic tests have shown that a detector with an intervention threshold for distortion of 5–10% is a good compromise between the output power perception, and the start of noise caused by saturation.

A known distortion detector, for example described in U.S. Pat. No. 5,068,620, is based on comparing the signals applied to the positive and negative inputs of the amplifier. When there is no distortion, the signals at the inputs of the amplifier are equal, and the distortion detector does not intervene; when the amplifier is causing distortion, the amplitude of the negative input is stabilized, whereas that of the positive input continues to increase; as soon as the difference between the signals reaches a certain value, a distortion signal is generated and is used to reduce the input signal.

In this known distortion detector, it is disadvantageous that the distortion detection threshold is dependent on the supply voltage, such that the accuracy of the detector depends on the supply voltage, as well as on the saturation of the amplifier power elements, on the temperature, and on the load. In addition, two comparators are necessary, one for each phase of the input signal.

SUMMARY OF THE INVENTION

According to the embodiments of the present invention, an amplifier and a method are provided for detecting distortion in an amplifier are provided. In accordance with one embodiment, an amplifier is provided that includes a first input, a first output supplying a first output signal; a first feedback network connected between the first input and the first output; a distortion detection circuit; the first feedback network having a first and a second feedback element arranged in series to form a first intermediate node supplying an intermediate signal that is in phase with the output signal when in the absence of distortion and that is in phase opposition when in the presence of distortion; and the distortion circuit having a phase comparator for detecting the phase of the output signal and the intermediate signal and generating a distortion-indicative signal when the intermediate signal is in phase opposition with respect to the output signal.

In accordance with a method of the disclosed embodiments of the present invention, detecting distortion in an amplifier having an input and an output supplying an output signal includes connecting a first and a second feedback element between the input and the output in series with each other, detecting an intermediate signal that is present between the first and second feedback elements, and generating a distortion-indicative signal when the intermediate is in phase opposition with respect to the output signal.

BRIEF DESCRIPTION OF THE DRAWINGS

For an understanding of the present invention, a preferred embodiment is now described, purely by way of non-limiting example, with reference to the attached drawings, wherein.

DETAILED DESCRIPTION OF THE INVENTION

Figure 1:
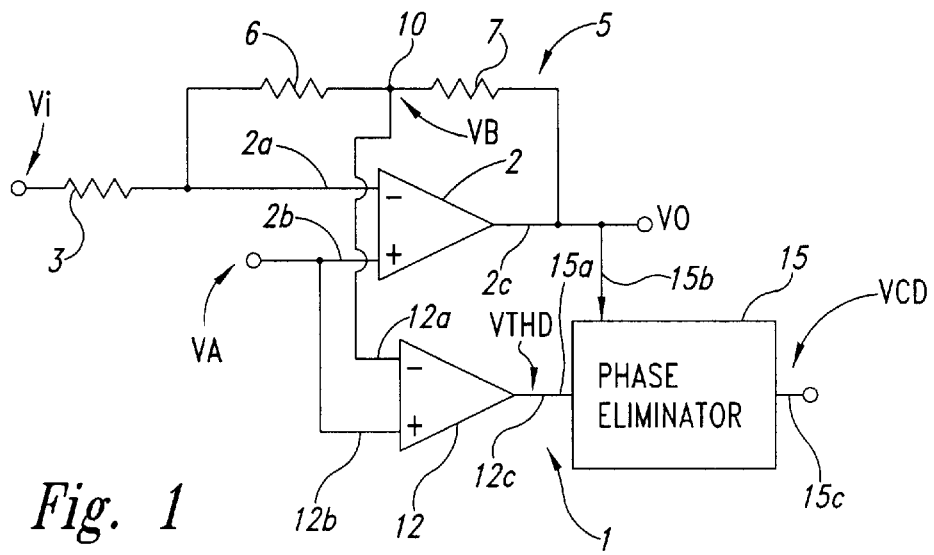
FIG. 1 shows a simplified diagram of a distortion detector according to one embodiment of the invention as applied to an audio amplifier of a first type.

FIG. 1 shows an embodiment of a distortion detection circuit 1 applied to an amplifier 2 with a single output, for example an audio amplifier, in an inverting configuration.

The amplifier 2 has an inverting input 2a, receiving an input signal Vi via an input resistor 3, and a non-inverting input 2b, receiving a first, constant reference voltage VA. The amplifier 2 also has an output 2c supplying an amplified output voltage Vo, and connected to the inverting input 2a via a feedback network 5, comprising a first and a second feedback resistor 6, 7, which are connected to one another in series at an intermediate node 10, at which an intermediate voltage VB is present.

The distortion detection circuit 1 comprises a comparator 12, having a positive input 12a connected to the intermediate node 10, a negative input 12b connected to the non-inverting input 2b of the amplifier 2, and an output 12c, supplying a phase-dependent signal VTHD to a first input 15a of a phase-eliminating circuit 15.

The phase-eliminating circuit 15 also has a second input 15b connected to the output 2c of the amplifier 2, and an output 15c supplying a distortion signal VCD to a known control circuit (not shown), which automatically reduces the level of the input signal Vi, in the presence of distortion, in a manner not shown in detail (according to the scheme described for example in U.S. Pat. No. 4,849,713 in the name of the same applicant).

The circuit of FIG. 1 operates as follows (see also FIG. 2). It is assumed that the input signal Vi has an average value VA; furthermore hereinafter the phase in which the output signal Vo is greater than VA is indicated as the positive phase, and the phase in which the output signal Vo is lesser than VA is indicated as the negative phase. As long as it is not distorted, the output voltage Vo follows the behavior of the input signal Vi, on the basis of the gain of the amplifier 2. In this condition, the intermediate voltage VB at the intermediate node 10 is obtained by simply dividing the output voltage Vo which is greater than the first reference voltage VA in the positive phase, and lower than the first reference voltage VA, in the negative phase. The phase-dependent signal VTHD therefore has a first value in the positive phase, and in absence of distortion (instants t0–t1, t4–t5), and a second value in the negative phase and in absence of distortion (instants t5–t6, t9–t10). The phase-eliminating circuit 15 recognizes the phase of the output voltage Vo, and generates at the output a first level of the distortion signal VCD, which is independent from the phase.

Figure 2:
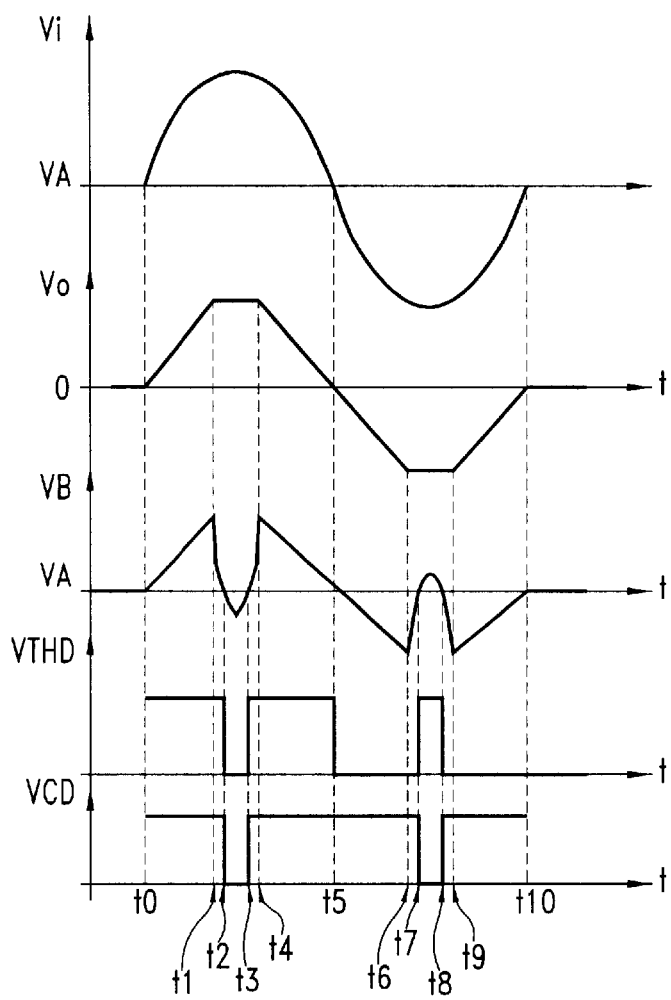
FIG. 2 shows the plot of selected electrical values measured on the circuit in FIG. 1.

When the signal Vo reaches its maximum dynamic level and begins to be distorted (instant t1 in FIG. 2), the intermediate voltage VB no longer increases, and instead decreases, as can be seen in FIG. 2. When the intermediate voltage VB exceeds a given distortion value (instant t2), the intermediate voltage VB becomes lower than the first reference voltage VA, and the phase-dependent signal VTHD assumes a second level. When the phase-detection circuit receives the second level of the phase-dependent signal VTHD, in presence of the positive phase of the output signal Vo, it recognizes the presence of the distortion, and generates at the output a second level of the distortion signal VCD. The phase-dependent signal VTHD and the distortion signal VCD remain at the second level as long as the predetermined distortion value is present (instant t3).

Similarly, in the negative phase, when the output signal Vo begins to be distorted (instant t6), the intermediate voltage VB begins to increase, and when it reaches the pre-determined distortion value (instant t7), it exceeds the first reference voltage VA. Consequently, the phase-dependent signal VTHD switches to the first logic level, and the distortion signal VCD, which is independent from the phase, switches to the second level. The phase-dependent signal VTHD and the distortion signal VCD switch once more respectively to the second and the first level, when the distortion is reduced to below the predetermined value (instant t8).

In practice, by splitting the feedback resistance in two parts (resistors 6, 7), and measuring the voltage of the intermediate point 10 (intermediate voltage VB), the obtained intermediate voltage VB is in phase with the output signal of the amplifier 2, before the latter is saturated, and is in phase opposition in presence of saturation. By detecting this phase equality or opposition, it is therefore possible to detect the distortion of the output signal.

Figure 3:
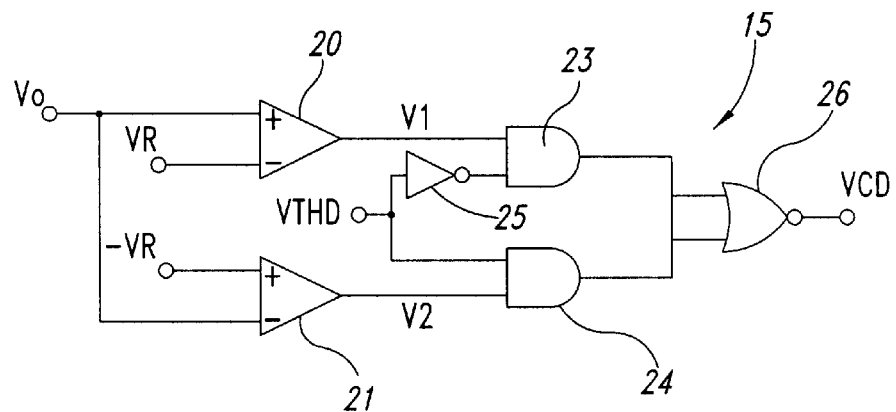
FIG. 3 shows a circuit diagram of a block in FIG. 1.

FIG. 3 shows an example of a phase-eliminating circuit 15 of FIG. 1. The phase-eliminating circuit 15 comprises a first and a second phase comparator 20, 21. The first phase comparator 20 has a positive input connected to the output of the amplifier 2, and therefore receives the output voltage Vo, a negative input which receives a second reference voltage VR, and an output (supplying a first phase signal V1) which is connected to an input of an AND gate 23. The second phase comparator 21 has a negative input which receives the output voltage Vo, a positive input which receives a third reference voltage −VR opposite to the second reference voltage VR, and an output (supplying a second phase signal V2) which is connected to an input of an AND gate 24. A second input of the AND gate 23 receives the phase-dependent signal VTHD and is inverted by an inverter 25, and a second input of the AND gate 24 receives the phase-dependent signal VTHD. The outputs of the AND gates 23, 24 are connected to the inputs of a NOR gate 26, supplying the distortion signal VCD.

The second reference voltage VR has a constant, positive value, and the third reference voltage −VR has a constant, negative value, which is opposite to the second reference voltage, in order to avoid spurious switching effects around the transition to zero of the output signal. Nonetheless, it is not essential for the third reference voltage to be opposite the second reference voltage.

Figure 4:
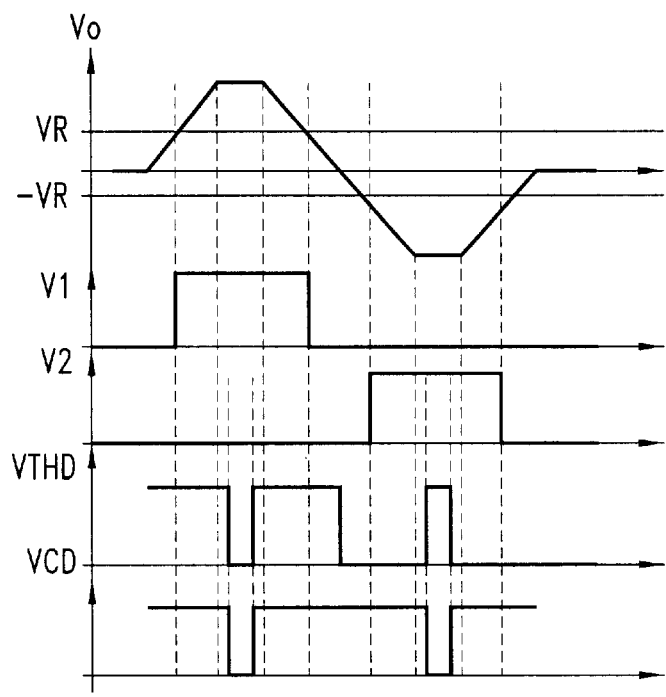
FIG. 4 shows the plot of selected electrical values measured on the circuit in FIG. 3.

As can be seen clearly from the wave forms in FIG. 4, the first phase signal V1 supplied by the first phase comparator 21 is positive when the output voltage Vo exceeds the second reference voltage VR, otherwise it is negative; the second phase signal V2 supplied by the second phase comparator 22 is positive when the output voltage Vo is lower than −VR.

By supplying the phase signals V1 and V2 to the AND gates 23, 24, which also receive the phase-dependent signal VTHD, respectively in inverted and direct form, by adding logically the output signals of the AND gates 23, 24, and inverting the signal thus obtained, the distortion signal VCD at the output has a high logic level in absence of distortion, and otherwise a low logic level.

Figure 5:
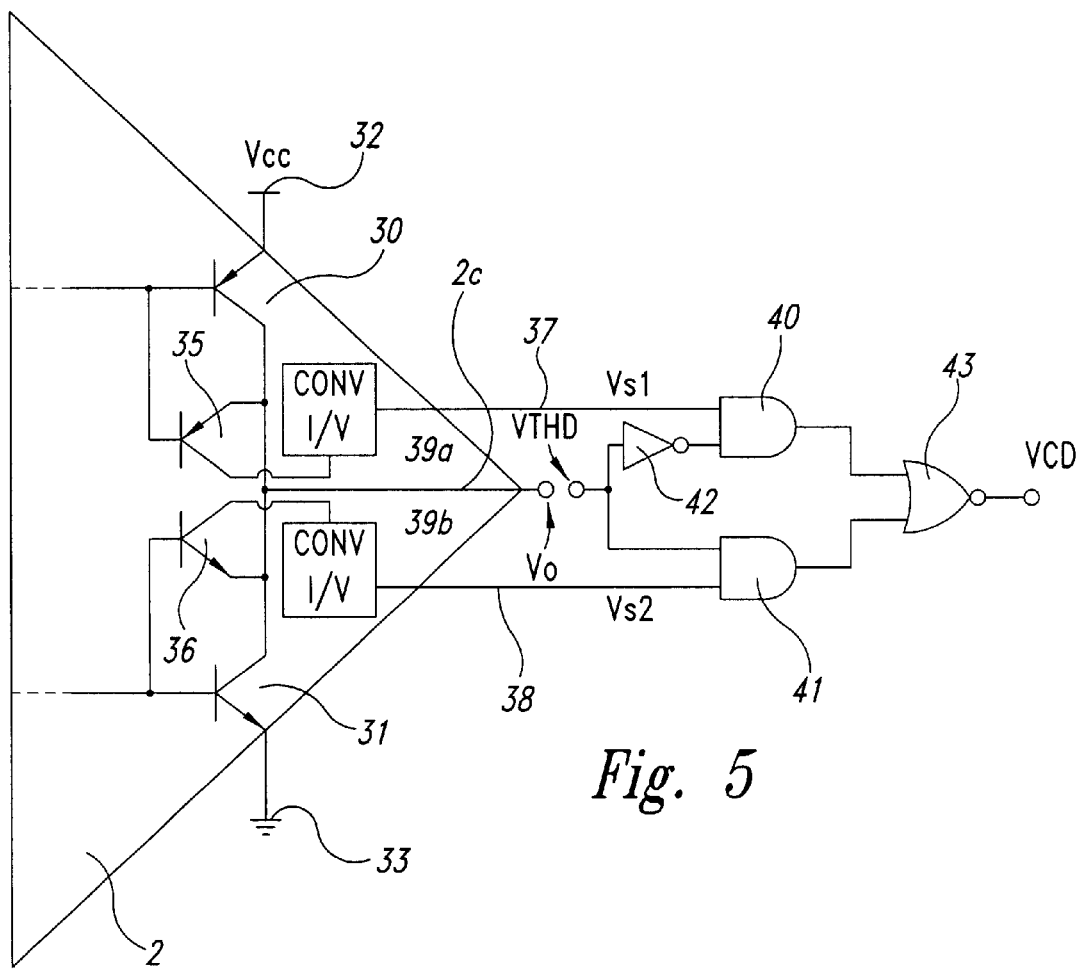
FIG. 5 shows a variant of the block in FIG. 3.

FIG. 5 shows an embodiment of the phase-eliminating circuit 15, based on direct detection of saturation of the output power transistors of the amplifier 2, which is normally already present. To this aim, only the final stage of the amplifier 2 is shown, comprising a first and a second power transistor 30, 31, connected between a supply line 32 and a ground line 33; the common node between the power transistors 30, 31 forms the output 2a.

The first power transistor 30 has a first terminal connected to the supply line 32, a control terminal (receiving an own driving signal generated by the preceding stages of the amplifier 2, in a per se known manner, not shown in detail) connected to the control terminal of a first saturation detection transistor 35, and a second terminal connected to the output 2c of the amplifier. The second power transistor 31 has a first terminal connected to the output 2c of the amplifier, a control terminal (receiving an own driving signal generated by the preceding stages of the amplifier 2) connected to the control terminal of a second saturation detection transistor 36, and a second terminal connected to the ground line 33.

The first saturation detection transistor 35 has a first terminal connected to the output 2c of the amplifier, and a second terminal connected, via a current/voltage converter 39a, to a first saturation output 37, thus supplying a first saturation signal Vs1; the second saturation detection transistor 36 has a first terminal connected to the output 2c of the amplifier 2, and a second terminal, connected via a current/voltage converter 39b, to a second saturation output 38, thus supplying a second saturation signal Vs2.

In the example shown, the first power transistor 30 and the first saturation detection transistor 35 are of PNP type, and the second power transistor 31 and the second saturation detection transistor 36 are of NPN type.

The phase-eliminating circuit 15 comprises two AND gates 40, 41, an inverter 42, and a NOR gate 43. In detail, the AND gate 40 has a first input connected to the first saturation output 37, and a second input receiving the phase-dependent signal VTHD, after being inverted by the inverter 42; the AND gate 41 has a first input connected to the second saturation output 38, and a second input, receiving the phase-dependent signal VTHD. The outputs of the AND gates 40, 41 are connected to the inputs of the NOR gate 43 which generates at the output the distortion signal VCD.

In the circuit in FIG. 5, in absence of distortion, the power transistors 30, 31 are off, or one of them is on and works in a linear region; thus the respective saturation detection transistors 35, 36 are off, and the saturation signals Vs1, Vs2 are low; on the other hand, when the output voltage Vo reaches the maximum value, and the first power transistor 30 begins to saturate, the first saturation detection transistor 35 switches on, and the saturation signal Vs1 switches to the high state. Similarly, when the output voltage Vo reaches the minimum value and the second power transistor 31 begins to saturate, the saturation signal Vs2 switches to the high state. In practice, besides of storing saturation data, the saturation signals Vs1, Vs2 also indicate the operation phase of the amplifier 2, and, specifically, the saturation signal Vs1 can be high only when the amplifier 2 is in the positive phase, and the saturation signal Vs2 can be high only when the amplifier 2 is in the negative phase.

Therefore, by using the saturation signals Vs1, Vs2, it is possible to eliminate the phase-dependence of the phase-dependent signal VTHD.

In particular, in the absence of distortion, as previously stated, the saturation signals Vs1, Vs2 are low, the AND gates 40, 41 are disabled, and the distortion signal VCD is high.

On the other hand, in the positive phase, when the output voltage Vo reaches the maximum value, and the distortion exceeds a predetermined value, as previously explained, the phase-dependent signal VTHD becomes low, and the AND gate 40 receives two "1"s, thus the distortion signal VCD switches to the low state and remains low as long as the phase-dependent signal VTHD remains low; similarly, in the negative phase, when the output voltage Vo reaches the minimum value, and the distortion exceeds a predetermined value, the phase-dependent signal VTHD becomes high, and the AND gate 41 receives two "1"s, thus the distortion signal VCD switches to the low state and remains low as long as the phase-dependent signal VTHD remains high.

Consequently, the circuit in FIG. 5 also supplies at the output a clipping-indicative signal; advantageously, the phase-eliminating circuit 15 in FIG. 5 does not use additional comparators, but utilizes components normally already present inside the amplifier 2, apart from some logic components, which are easy to produce, and require a reduced integration area.

Figure 6:
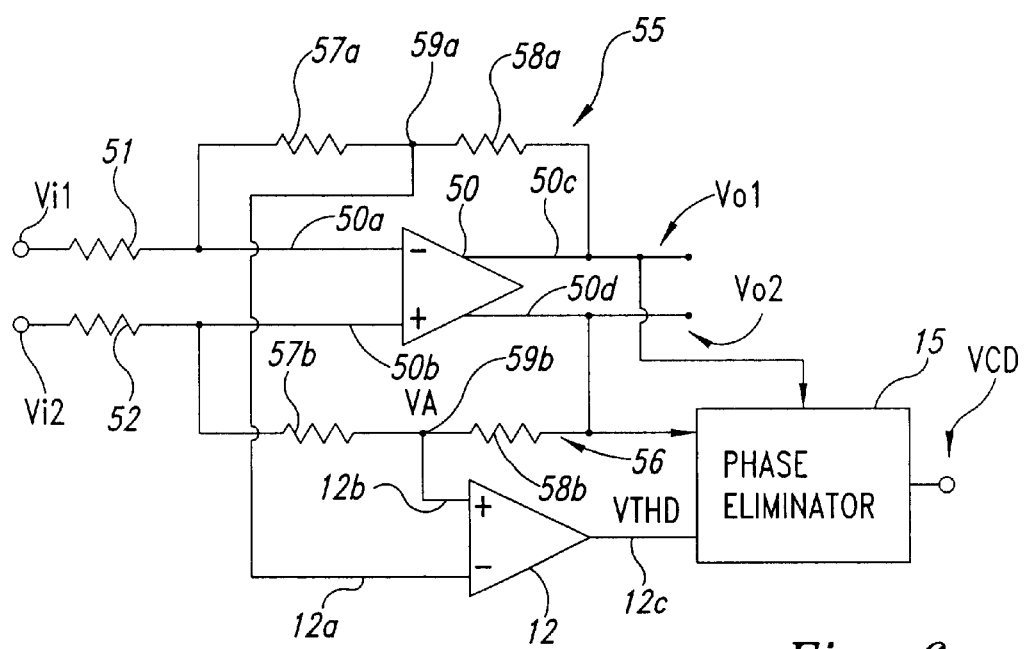
FIG. 6 shows a simplified diagram of another embodiment of a distortion detector according to the invention as applied to an audio amplifier of a second type.

FIG. 6 shows a fully differential amplifier 50, which has an inverting input 50a receiving a first input voltage V1 via a first input resistor 51; a non-inverting input 50b receiving a second input voltage Vi2 via a second input resistor 52; a first output 50c supplying a first output voltage Vo1; and a second output 50d supplying a second output voltage Vo2.

A first feedback network 55 connects the first output 50c to the first input 50a, and a second feedback network 56 connects the second output 50d to the second input 50b. The feedback networks 55, 56 comprise two resistors, respectively 57a, 58a and 57b, 58b, which define a respective intermediate node 59a, 59b; the intermediate nodes 59a, 59b are connected to the inputs 12b, 12a of the comparator 12.

The output 12c of the comparator 12, and the outputs 50c, 50d of the amplifier 50 are connected to the phase-eliminating circuit 15, which, as in the diagram in FIG. 1, supplies at the output the distortion signal VCD.

The advantages of the described circuit are as follows. Firstly, it supplies a distortion signal independent from the supply voltage, and not affected by the saturation of the power transistors, therefore it does not depend on the temperature and on the load connected to the output of the amplifier 2. In addition, by appropriately calibrating the ratios of the resistors 3, 6, 7; 51, 57a, 58a; 52, 57b, 58b, it is possible to accurately select the percentage of distortion to be detected which activates reduction of the input signal. For example, to obtain the distortion signal VCD to be generated when the distortion is 10%, with an amplifier gain of 4, the following resistance values can be selected: resistance R1 of resistors 3, 51, 52 of 1 KΩ; resistance R2 of resistors 6, 57a, 57b of 220 Ω; resistance R3 of resistors 7, 58a, 58b of 3.78 KΩ.

Finally, it is apparent that many modifications and variants can be made to the circuit described and illustrated, all of which come within the scope of the invention, as defined in the attached claims. For example, instead of receiving the third reference voltage −VR, the second phase comparator 21 can receive the second reference voltage VR, such as to generate a second phase signal V2 in addition to the first phase signal V1; alternatively, the third reference voltage can be correlated to the second reference voltage VR.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An amplifier, comprising:
 a first input;
 a first output supplying a first output signal;
 a first feedback network, connected between said first input and said first output;
 a distortion detection circuit;
 said first feedback network comprising a first and a second feedback element arranged in series to form a first intermediate node supplying an intermediate signal that is in phase with said output signal when in the absence of distortion, and is in phase opposition when in the presence of distortion;
 and said distortion detection circuit comprising phase comparator means detecting the phase of said output signal and said intermediate signal, and generating a distortion-indicative signal when said intermediate signal is in phase opposition with respect to said output signal.

2. The amplifier of claim 1, wherein said first and second feedback elements each comprise a resistive element.

3. The amplifier of claim 1, wherein said phase comparator means comprise a first comparator and a phase-eliminating circuit, said first comparator having a first input connected to said first intermediate node, a second input receiving an electrical reference value, and an output supplying a phase-dependent signal, and said phase-eliminating circuit having a first input connected to said output of said first comparator, a second input connected to said first output of said amplifier, and an output supplying a distortion signal.

4. The amplifier of claim 3, wherein said phase-eliminating circuit comprises a second and a third comparator and a logic circuit; said second and third comparators receiving said output signal and a respective reference signal in an opposite mode to each other, and supplying opposite phase signals; said logic circuit receiving said opposite phase signals and said phase-dependent signal, and generating the distortion-indicative signal.

5. The amplifier of claim 3, comprising a first and a second power device, connected to said first output of said amplifier, and a first and a second saturation detection circuit, connected to a respective power device and supplying a respective saturation signal, and said phase-eliminating circuit comprising a logic circuit that receives said saturation signals and said phase-dependent signal, and generates the distortion-indicative signal.

6. The amplifier of claim 3, of a fully differential type, with a second input, a second output and a second feedback network connected between said second input and said second output, wherein said second feedback network comprises a third and a fourth feedback element, arranged in series and forming a second intermediate node, and said second input of said first comparator is connected to said second intermediate node, said phase-eliminating circuit having a third input connected to said second output of said amplifier.

7. A method for detecting distortion in an amplifier having an input and an output supplying an output signal;
   comprising the steps of:
      connecting a first and a second feedback element between said input and said output in series with each other;
      detecting an intermediate signal that is present between said first and second feedback elements; and
      generating a distortion-indicative signal when said intermediate signal is in phase opposition with respect to said output signal.

8. The method of claim 7, wherein said step of generating a distortion-indicative signal comprises the steps of generating a phase-dependent signal when said intermediate signal changes sign with respect to said output signal, and multiplying said phase-dependent signal and phase signals, thereby obtaining a distortion-indicative signal.

9. The method of claim 8, wherein said phase signals are obtained by comparing said output signal with at least one predetermined value.

10. The method of claim 8, wherein said phase signals are saturation signals.

11. The method of claim 7, wherein said input of said amplifier receives an input signal via a first resistive element, and said first and second feedback elements comprise a second and a third resistive element, and a step of calibrating the detected distortion percentage by modifying the resistance of said first, second and third resistive elements.

12. A distortion compensation circuit, comprising:
   a distortion detector configured to detect distortion in an output signal and to output an intermediate signal that is responsive to the output signal; and
   a phase-elimination circuit configured to detect the phase of the output signal and the intermediate signal and to generate a distortion-indicative signal when the intermediate signal is in phase opposition to the output signal;
   wherein the distortion detector comprises a resistive feedback network coupled between the output signal and an input signal, and further wherein the resistive feedback network including a first and a second feedback element arranged in series to form an intermediate node, the resistive feedback network configured to output the intermediate signal in phase with the output signal when no distortion is detected, and to output the intermediate signal not in phase with the output signal when there is distortion in the output signal.

13. The circuit of claim 12, wherein the phase-elimination circuit comprises a first comparator having a first input coupled to the intermediate node and a second input configured to receive a voltage reference signal and to generate a phase-dependent signal; a second and a third comparator each configured to receive the output signal and a respective first and second reference signal that are in phase opposition to each other, the second and third comparators configured to output opposite phase signals; first and second AND gates each configured to receive a respective phase signal and, respectively, an inverted and non-inverted phase-dependent signal; and a NOR gate configured to receive an output from each AND gate and to output the distortion-indicative signal.

14. The circuit of claim 12, wherein the phase-elimination circuit is configured to receive first and second saturation signals and the intermediate signal and to generate the distortion-indicative signal responsive to the first and second saturation signals and the intermediate signal.

15. The circuit of claim 14, wherein the phase-elimination circuit comprises first and second AND gates each configured to receive a respective phase signal and, respectively, an inverted and non-inverted phase-dependent signal; and a NOR gate configured to receive an output from each AND gate and to output the distortion-indicative signal.

16. The circuit of claim 15, wherein the distortion detector is configured to detect first and second distortion output signals and to output the intermediate signal.

* * * * *